(12) United States Patent
Aoki et al.

(10) Patent No.: US 6,608,502 B2
(45) Date of Patent: Aug. 19, 2003

(54) COMPACT TRANSMITTER DETECTION CIRCUIT WITH A WIDE DYNAMIC RANGE

(75) Inventors: Kazuharu Aoki, Fukushima-ken (JP); Jiro Kikuchi, Fukushima-ken (JP)

(73) Assignee: Alps Electric Co., Ltd., Tokyo (JP)

( * ) Notice: Subject to any disclaimer, the term of this patent is extended or adjusted under 35 U.S.C. 154(b) by 0 days.

(21) Appl. No.: 10/124,129

(22) Filed: Apr. 17, 2002

(65) Prior Publication Data

US 2003/0020515 A1 Jan. 30, 2003

(30) Foreign Application Priority Data

Apr. 18, 2001 (JP) ........................................ 2001-120090

(51) Int. Cl.[7] .............................................. G01R 19/00
(52) U.S. Cl. ......................................... 327/58; 327/62
(58) Field of Search ............................ 327/50, 58, 62, 327/65–67, 77, 350–352

(56) References Cited

U.S. PATENT DOCUMENTS 3,712,989 A  *  1/1973  Barton ......................... 327/61
4,453,091 A  *  6/1984  Katakura et al. .............. 327/97
4,689,576 A  *  8/1987  Wisseman ................... 327/362
6,275,684 B1    8/2001  Kaneko et al. .............. 455/118

FOREIGN PATENT DOCUMENTS

JP    2000-286656    10/2000
JP    2001-358600    12/2001

* cited by examiner

Primary Examiner—Kenneth B. Wells
(74) Attorney, Agent, or Firm—Brinks Hofer Gilson & Lione

(57) ABSTRACT

A transmission signal which is output from a power amplifier is rectified by a first rectifying circuit and is then input to a first transistor of a voltage-to-current converting circuit, while the reference voltage is output from a second rectifying circuit and is then input to a second transistor of the voltage-to-current converting circuit. The output current of the first transistor is subtracted from the output current of the second transistor via a first current-mirror circuit, and a current that is proportional to the output voltage of the power amplifier is caused to flow to a two-terminal p-n junction electronic device. Then, a voltage that is proportional to the logarithm of the current is output from across the p-n junction electronic device.

5 Claims, 4 Drawing Sheets

COMPACT TRANSMITTER DETECTION CIRCUIT WITH A WIDE DYNAMIC RANGE

BACKGROUND OF THE INVENTION

1. Field of the Invention

The present invention relates to a circuit for detecting the output power of a transmitter.

2. Description of the Related Art

A typical transmitter detection circuit for use in cellular telephones, etc., is now described with reference to FIG. 4.

A transmission signal is amplified by a power amplifier 51 to a predetermined output power, and is then transmitted from an antenna 52. A portion of the transmission signal from the power amplifier 51 is rectified and voltage doubled by a detection circuit 53 before the resulting signal is output as an AGC (automatic gain control) voltage to the power amplifier 51. The amplification of the power amplifier 51 is controlled so that the output voltage of the power amplifier 51 is constant.

The detection circuit 53 includes a first diode 55 to which a forward voltage is supplied by a bias voltage source 54, and a second diode 56 whose anode is connected to the cathode of the first diode 55. The anode of the first diode 55 is grounded via a DC blocking capacitor 61, and the cathode of the second diode 56 is grounded via a smoothing capacitor 62. The cathode of the second diode 56 is also coupled with the ground via a first resistor 57 and a second resistor 58 which are connected in series. The node between the first resistor 57 and the second resistor 58 is connected to an output port 63.

The operation of the thus constructed detection circuit 53 is now described.

A portion of the transmission signal from the power amplifier 51 is input to the node between the cathode of the first diode 55 and the anode of the second diode 56 via a charging capacitor 59 and a series resistor 60. The transmission signal is rectified and voltage doubled, and a voltage that is proportional to the output power is output from the node between the first resistor 57 and the second resistor 58, and is applied as an AGC voltage to the power amplifier 51 from the output port 63.

In such a structure, the detection circuit 53 has a narrow dynamic range, leading to a problem in that the dynamic range for the output power of the transmission signal is also narrow.

SUMMARY OF THE INVENTION

Accordingly, it is an object of the present invention to provide a detection circuit with a wide dynamic range.

To this end, according to the present invention, a transmitter detection circuit includes a first rectifying circuit for rectifying a transmission signal output from a power amplifier, and a logarithmic amplifier. The logarithmic amplifier includes a voltage-to-current converting circuit for outputting an electric current that is proportional to the output voltage of the first rectifying circuit, and a two-terminal p-n junction electronic device to which the electric current flows to produce a voltage thereacross that is proportional to the logarithm of the electric current.

The voltage-to-current converting circuit may include first and second transistors which perform differential operation, a constant-current source connected to one of the collector and the emitter of the first and second transistors, and a first current-mirror circuit connected to the other. The output voltage of the first rectifying circuit may be input to the base of the first transistor or the second transistor. The input end of the first current-mirror circuit may be connected to the first transistor, and the output end of the first current-mirror circuit may be connected to the second transistor, thereby causing an electric current that is equal to a difference between an electric current which flows to the second transistor and an electric current which flows to the transistor at the output end side of the current-mirror circuit to flow to the p-n junction electronic device.

The detection circuit preferably includes a second rectifying circuit having the same structure as that of the first rectifying circuit. The same bias voltage may be applied to rectifiers of the first and second rectifying circuits. The output voltage of one of the first and second rectifying circuits may be input to the base of the first transistor, and the output voltage of the other rectifying circuit may be input to the base of the second transistor.

The p-n junction electronic device may comprise a third transistor of which the base and the collector are coupled with each other.

The p-n junction electronic device may comprise a diode.

The voltage-to-current converting circuit and the p-n junction electronic device may be incorporated into a single integrated circuit.

The node between the first transistor or the second transistor and the first current-mirror circuit may be coupled with the ground or a power supply voltage via a first resistor.

DESCRIPTION OF THE PREFERRED EMBODIMENTS

Figure 1:
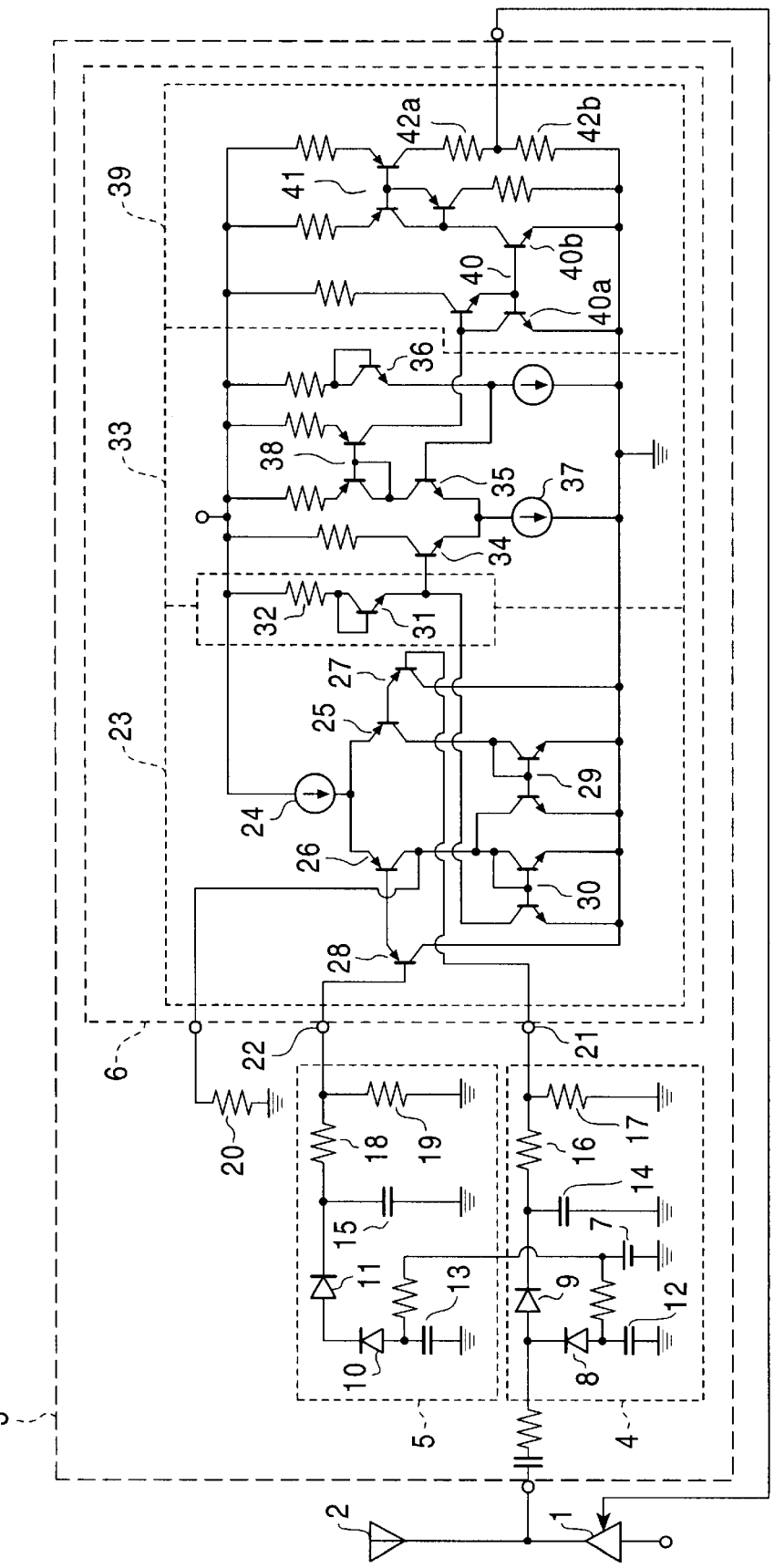
FIG. 1 is a circuit diagram of a transmitter detection circuit according to a first embodiment of the present invention.

A transmitter detection circuit according to a first embodiment of the present invention is now described with reference to FIG. 1.

A transmission signal is amplified by a power amplifier 1 to a predetermined output power, and is then transmitted from an antenna 2. A portion of the transmission signal output from the power amplifier 1 is input to and detected by a detection circuit 3. The detected voltage is input as an AGC (automatic gain control) voltage to the power amplifier 1. The amplification of the power amplifier 1 is controlled so that the output voltage of the power amplifier 1 is constant.

The detection circuit 3 includes a first rectifying circuit 4, a second rectifying circuit 5, and a logarithmic amplifier 6. The first rectifying circuit 4 has first and second rectifiers 8 and 9 formed of diodes. The first rectifier 8 and the second rectifier 9 are connected in series, and a forward voltage is supplied thereto by a bias voltage source 7. The anode of the first rectifier 8 is grounded via a first DC blocking capacitor 12, and the cathode of the second rectifier 9 is grounded via a first smoothing capacitor 14. The cathode of the second rectifier 9 is also grounded via a first resistor 16 and a second resistor 17 which are connected in series. The node between the first resistor 16 and the second resistor 17 is connected to a first input port 21 of the logarithmic amplifier 6.

The second rectifying circuit 5 is connected to a second input port 22 of the logarithmic amplifier 6. The second rectifying circuit 5 has the same structure as the first rectifying circuit 4. The second rectifying circuit 5 has a third rectifier 10, and a fourth rectifier 11 whose anode is connected to the cathode of the third rectifier 10. The anode of the third rectifier 10 is grounded via a second DC blocking capacitor 13, and the cathode of the fourth rectifier 11 is grounded via a second smoothing capacitor 15. The cathode of the fourth rectifier 11 is also coupled with ground via a third resistor 18 and a fourth resistor 19 which are connected in series. A bias voltage is supplied to the third rectifier 10 and the fourth rectifier 11 from the bias voltage source 7. The node between the third resistor 18 and the fourth resistor 19 is connected to the second input port 22 of the logarithmic amplifier 6.

The logarithmic amplifier 6 is a single integrated circuit, and includes a voltage-to-current converting circuit 23, a p-n junction electronic device 31, an inverter circuit 33, and an amplifying circuit 39.

The voltage-to-current converting circuit 23 includes a third transistor 27 of the p-n-p type whose base is connected to the first input port 21, a first transistor 25 of the p-n-p type whose base is connected to the emitter of the third transistor 27, a fourth transistor 28 of the p-n-p type whose base is connected to the second input port 22, a second transistor 26 of the p-n-p type whose base is connected to the emitter of the fourth transistor 28, a first constant-current source 24 connected to the emitters of the first transistor 25 and the second transistor 26, a first current-mirror circuit 29 whose input terminal is connected to the collector of the first transistor 25 and whose output terminal is connected to the collector of the second transistor 26, and a second current-mirror circuit 30 whose input terminal is connected to the collector of the second transistor 26. The first transistor 25 and the second transistor 26 serve as a differential amplifier for performing differential operation. The collector of the second transistor 26 is grounded via an adjustment resistor 20 external to the integrated circuit. The adjustment resistor 20 is a resistor which is adapted to cause a predetermined electric current to flow out of the voltage-to-current converting circuit 23 so that variations in characteristic between the first transistor 25 and the second transistor 26 and between the third transistor 27 and the fourth transistor 28 in the integrated circuit can be cancelled out.

The p-n junction electronic device 31 comprises an n-p-n transistor whose base and collector are coupled with each other, to which a constant voltage Vcc of 3 V is applied via a resistor 32, and whose emitter is connected to the output terminal of the second current-mirror circuit 30.

The inverter circuit 33 includes a differential amplifier consisting of a fifth transistor 34 and a sixth transistor 35, and a third current-mirror circuit 38. The emitters of the fifth transistor 34 and the sixth transistor 35 are connected to a second constant-current source 37. The collector of the sixth transistor 35 is connected to the input terminal of the third current-mirror circuit 38. The base of the fifth transistor 34 is connected to the emitter of the p-n junction electronic device 31. A voltage drop due to a seventh transistor 36 is applied to the base of the sixth transistor 35.

The amplifying circuit 39 includes a fourth current-mirror circuit 40, and a fifth current-mirror circuit 41. The fourth current-mirror circuit 40 has an area between the base and emitter of a transistor 40b at the output side which is five times larger than an area between the base and emitter of a transistor 40a at the input side, so that the current which enters from the input end can be magnified by a factor of five, which is then output from the output end. The output of the fourth current-mirror circuit 40 acts as an AGC voltage to the power amplifier 1 via the fifth current-mirror circuit 41.

The operation of the thus constructed transmitter detection circuit according to the first embodiment is now described.

A transmission signal is amplified by the power amplifier 1, and is then transmitted from the antenna 2. The output terminal of the power amplifier 1 is also connected to the detection circuit 3, so that the amplified transmission signal is input to the detection circuit 3.

The transmission signal input to the detection circuit 3 is rectified and voltage doubled by the first rectifying circuit 4, and the resulting voltage is input to the first input port 21 of the logarithmic amplifier 6.

The output voltage which is input to the logarithmic amplifier 6 is amplified by the third transistor 27 of the voltage-to-current converting circuit 23, before it is input to the first transistor 25. On the other hand, the output voltage of the second rectifying circuit 5 is used as a reference voltage, and is amplified by the fourth transistor 28 before it is input to the second transistor 26. The voltages are subjected to differential amplification by the first transistor 25 and the second transistor 26.

If the output voltage of the first rectifying circuit 4 is $V_1$ (unit: V), the output voltage of the second rectifying circuit 5 is $V_2$ (unit: V), and the current which flows from the first constant-current source 24 is IT (unit: mA), then the electric current $I_1$ (unit: mA) which is input to the first current-mirror circuit 29 from the collector of the first transistor 25 is expressed as follows:

$$I_1 = -m_1(V_1 - V_2) + \frac{IT}{2} \qquad \text{(Eq. 1)}$$

where $m_1$ denotes a constant.

The current $I_2$ (unit: mA) which flows from the second transistor 26 is expressed as follows:

$$I_2 = m_1(V_1 - V_2) + \frac{IT}{2} \qquad \text{(Eq. 2)}$$

Then, the current $I_3$ (unit: mA) which is input to the second current-mirror circuit 30 is expressed as follows:

$$I_3 = I_2 - I_1 = 2m_1(V_1 - V_2) \qquad \text{(Eq. 3)}$$

The current $I_4$ (unit: mA) which is output from the second current-mirror circuit 30 is equal to the current $I_3$, and is proportional to the voltage difference between the output voltages of the first rectifying circuit 4 and the second rectifying circuit 5. Since a bias voltage is applied to the first rectifying circuit 4 and the second rectifying circuit 5 by the same bias voltage source 7, the current which flows to the p-n junction electronic device 31 is proportional to the voltage of the transmission signal.

The voltage Vbe produced between the base and emitter of the p-n junction electronic device 31 is given by the following equation:

$$Vbe = \frac{kT}{q} \log_e \frac{I_4}{I_s} \qquad \text{(Eq. 4)}$$

where $I_4$ denotes the current which flows to the p-n junction electronic device 31, k denotes the Boltzmann constant, T denotes the temperature, q denotes the electronic charge of an electron, and $I_s$ denotes the reverse current between the base and emitter of the p-n junction electronic device 31.

Since the current $I_4$ is proportional to the voltage of the transmission signal, if $I_4 = m_2 Vin$, then the voltage Vbe is expressed as follows:

$$Vbe = \frac{kT}{q} \log_e \frac{m_2 Vin}{I_s} \qquad \text{(Eq. 5)}$$

where $m_2$ denotes a constant.

The voltage of the emitter of the p-n junction electronic device 31 is input to the inverter circuit 33, and the voltage Vo which is input to the inverter circuit 33 is given by the following equation, with a constant voltage Vcc (unit: V) and the resistor 32 having resistance R (unit: Ω):

$$Vo = Vcc - Rm_2 Vin - \frac{kT}{q} \log_e \frac{m_2 Vin}{I_s} \qquad \text{(Eq. 6)}$$

In order to design the voltage drop due to the seventh transistor 36 so as to have an appropriate magnitude, the current $I_5$ (unit: mA) which is output from the inverter circuit 33 is expressed as follows:

$$I_5 = m_2 \frac{kT}{q} \log_e \frac{m_2 Vin}{I_s} \qquad \text{(Eq. 7)}$$

The current $I_5$ is input to the third current-mirror circuit 38, and a current $I_6$ having the same magnitude is input to the amplifying circuit 39. The current $I_6$ is amplified by a factor of five in the fourth current-mirror circuit 40 of the amplifying circuit 39. The resulting current $I_7$ is input to the fifth current-mirror circuit 41. The current $I_8$ output from the fifth current-mirror circuit 41 is divided by resistors 42a and 42b so that a voltage that is proportional to the current $I_8$ is output and is input as an AGC voltage to the amplifier 1. Therefore, the AGC voltage is proportional to the current $I_5$, and the AGC voltage is expressed as follows:

$$Vout = m_3 I_5 = m_3 m_2 \frac{kT}{q} \log_e \frac{m_2 Vin}{I_s} \qquad \text{(Eq. 8)}$$

where $m_3$ denotes a constant.

Now, a transmitter detection circuit according to a second embodiment of the present invention is described with reference to FIG. 2. The second embodiment is different from the first embodiment shown in FIG. 1 in the following points: (1) the output of the first rectifying circuit 4 is connected to the base of the second transistor 26, and the output of the second rectifying circuit 5 is connected to the base of the first transistor 25; (2) the first to fourth transistors 25 to 28 comprise n-p-n transistors; and (3) the p-n junction electronic device 31 comprises a diode. In this case, again, a voltage that is proportional to the logarithm of the voltage of the transmission is output from the p-n junction electronic device 31.

The operation of the detection circuit 3 according to the second embodiment is now described.

A transmission signal is rectified and voltage doubled by the first rectifying circuit 4, and is then input to the first input terminal 21 of the logarithmic amplifier 6. The output of the second rectifying circuit 5 is connected to the second input terminal 22.

If the output voltage of the first rectifying circuit 4 is $V_1$ (unit: V), the output voltage of the second rectifying circuit 5 is $V_2$ (unit: V), and the current which flows from the first constant-current source 24 is IT (unit: mA), then the electric current $I_1$ (unit: mA) which is input to the first current-mirror circuit 29 from the collector of the first transistor 25 is expressed as follows:

$$I_1 = -m_1(V_1 - V_2) + \frac{IT}{2} \qquad \text{(Eq. 9)}$$

The current $I_2$ (unit: mA) which flows from the second transistor 26 is expressed as follows:

$$I_2 = m_2(V_1 - V_2) + \frac{IT}{2} \qquad \text{(Eq. 10)}$$

Then, the current $I_3$ (unit: mA) which is input to the second current-mirror circuit 30 is expressed as follows:

$$I_3 = I_2 - I_1 = 2m_1(V_1 - V_2) \qquad \text{(Eq. 11)}$$

The current $I_4$ (unit: mA) which is output from the second current-mirror circuit 30 is equal to the current $I_3$, and is proportional to the voltage difference between the output voltages of the first rectifying circuit 4 and the second rectifying circuit 5. Since a bias voltage is applied to the first rectifying circuit 4 and the second rectifying circuit 5 by the same bias voltage source 7, the current which flows to the p-n junction electronic device 31 is proportional to the voltage of the transmission signal.

Where the current $I_4$ flows to the p-n junction electronic device 31, the voltage generated between the anode and cathode of the p-n junction electronic device 31 is given by the following equation:

$$Vbe = \frac{kT}{q}\log_e\frac{I_4}{I_s} \quad \text{(Eq. 12)}$$

Figure 2:
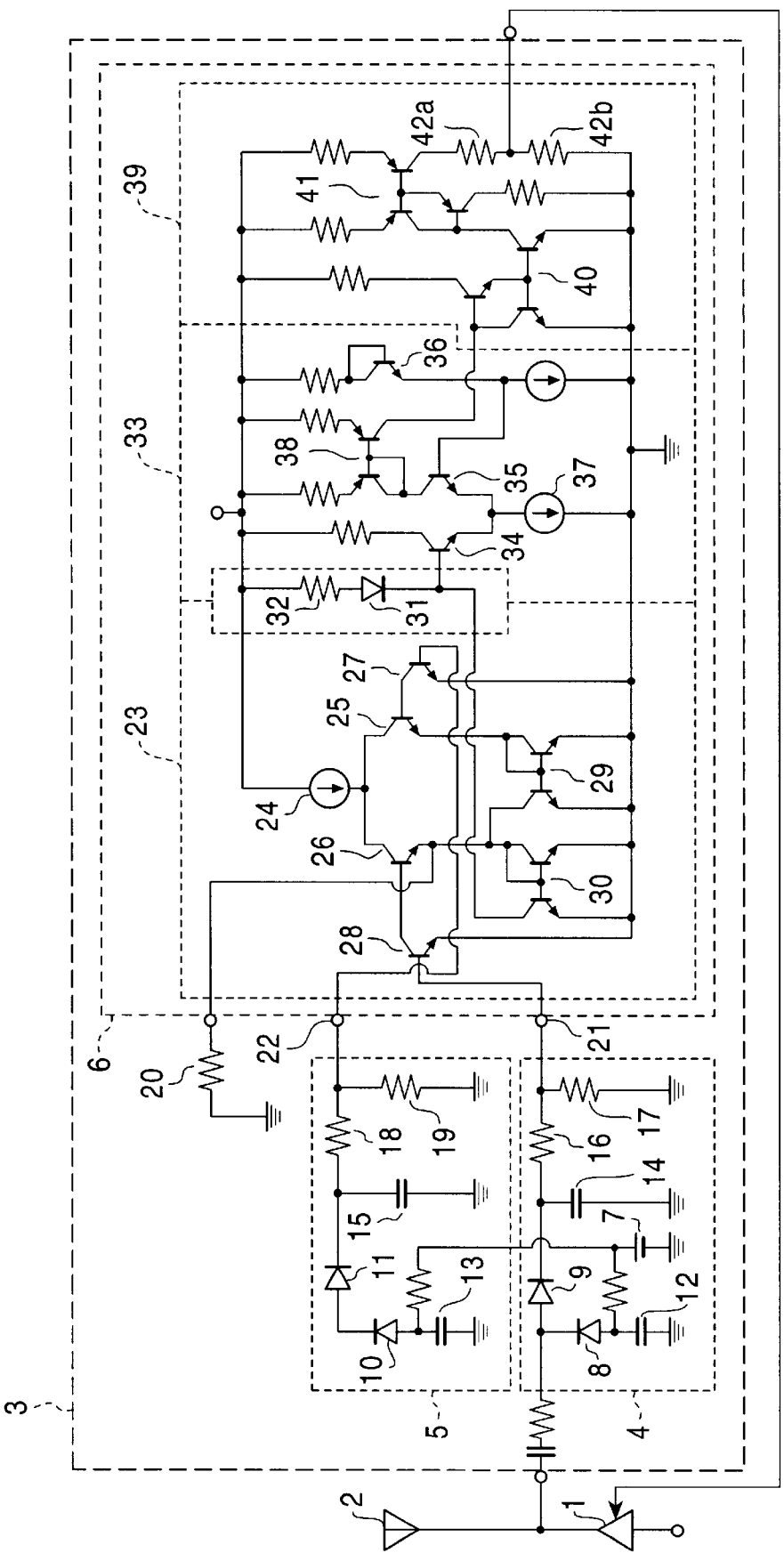
FIG. 2 is a circuit diagram of a transmitter detection circuit according to a second embodiment of the present invention.

The operation of the inverter circuit 33 and the amplifying circuit 39 is the same as that in the first embodiment shown in FIG. 1, and is not described herein.

Figure 3:
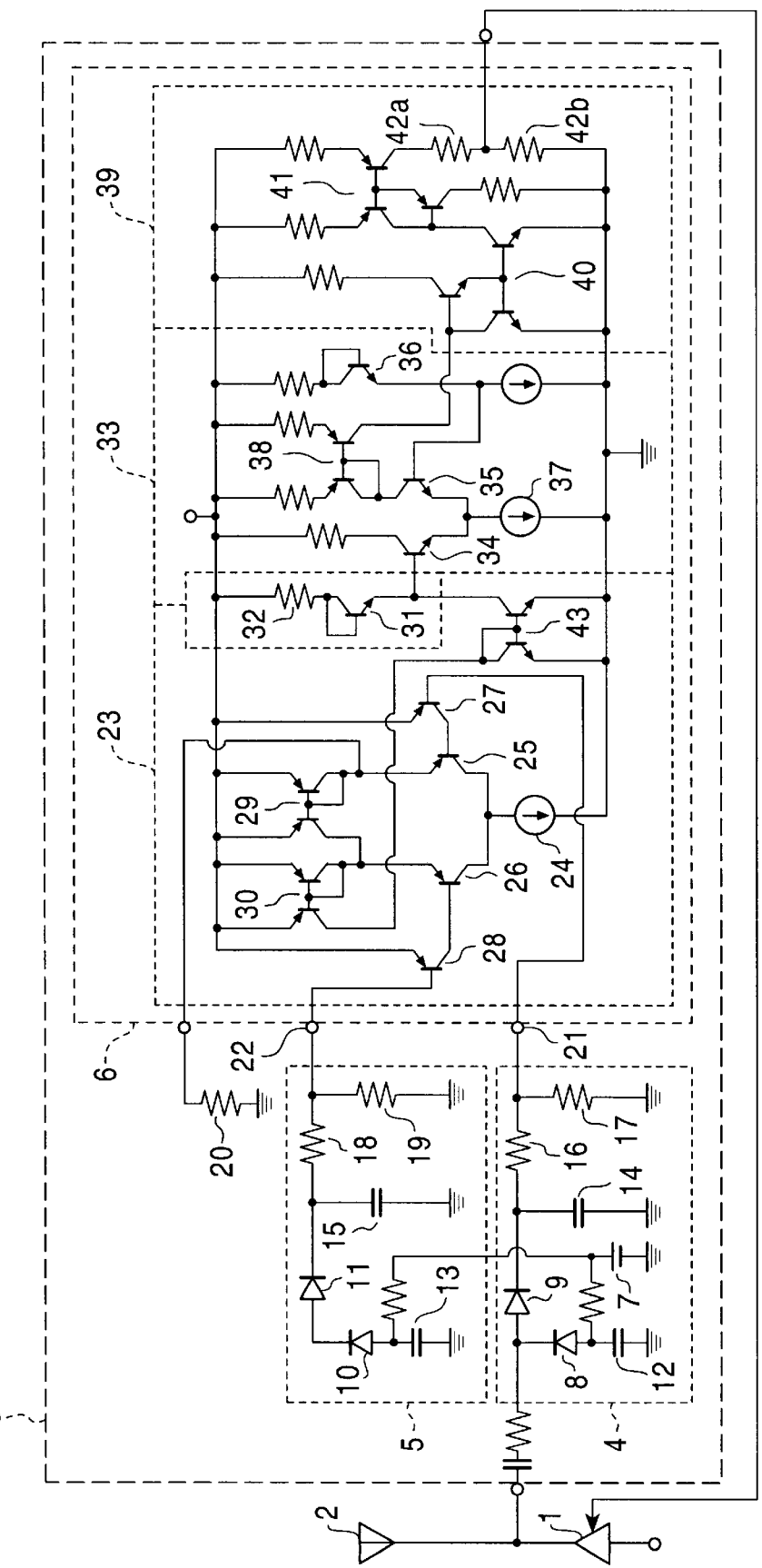
FIG. 3 is a circuit diagram of a transmitter detection circuit according to a third embodiment of the present invention.
Figure 4:
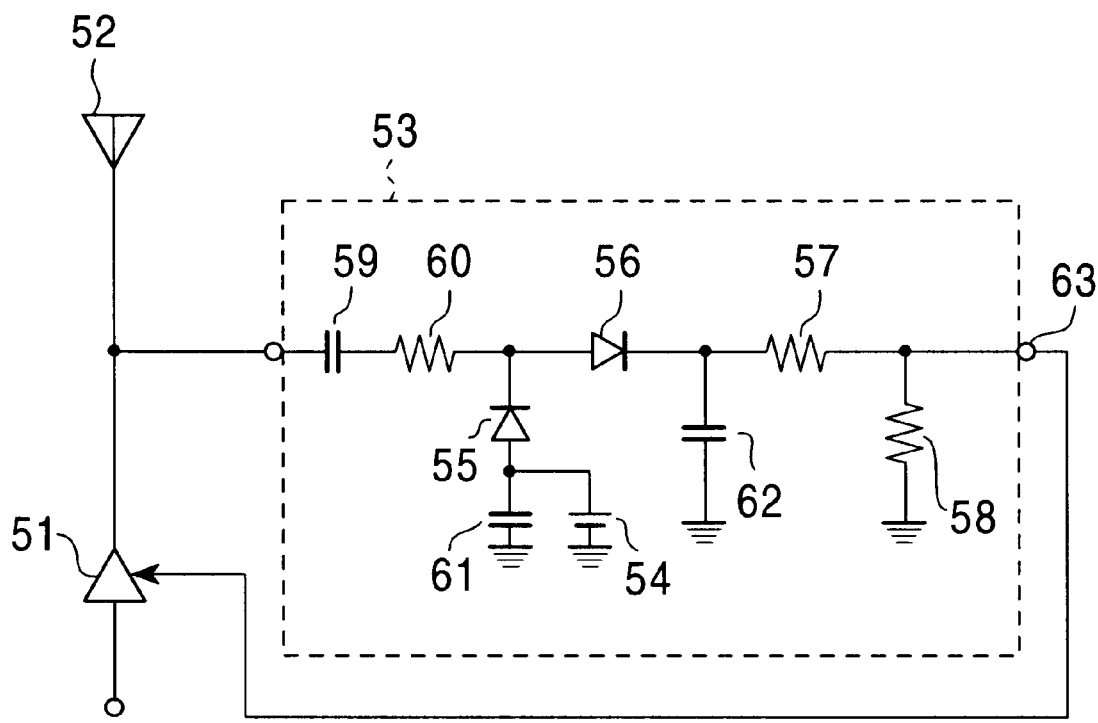
FIG. 4 is a circuit diagram of a typical transmitter detection circuit.

Now, a transmitter detection circuit according to a third embodiment of the present invention is described with reference to FIG. 3.

The third embodiment is different from the first embodiment shown in FIG. 1 in the following points: (1) the first current-mirror circuit 29 and the second current-mirror circuit 30 are placed on the power supply side of the first transistor 25 and the second transistor 26 which serve as a differential amplifier, while the first constant-current source 24 is placed at the ground side; (2) one end of the adjustment resistor 20 is connected between the first transistor 25 and the input terminal of the first current-mirror circuit 29, while a power supply voltage is applied to the other end of the adjustment resistor 20; and (3) a sixth current-mirror circuit 43 is provided between the second current-mirror circuit 30 and the p-n junction electronic device 31. In this case, again, a current that is proportional to the voltage of the transmission signal is output from the voltage-to-current converting circuit 23.

The operation of the detection circuit 3 according to the third embodiment is now described.

A transmission signal is rectified and voltage doubled by the first rectifying circuit 4, and is then input to the first input terminal 21 of the logarithmic amplifier 6. The output of the second rectifying circuit 5 is connected to the second input terminal 22.

If the output voltage of the first rectifying circuit 4 is $V_1$ (unit: V), the output voltage of the second rectifying circuit 5 is $V_2$ (unit: V), and the current which flows from the first constant-current source 24 is IT (unit: mA), then the electric current $I_1$ (unit: mA) which is input to the first current-mirror circuit 29 from the collector of the first transistor 25 is expressed as follows:

$$I_1 = -m_1(V_1 - V_2) + \frac{IT}{2} \quad \text{(Eq. 13)}$$

The current $I_2$ (unit: mA) which flows from the second transistor 26 is expressed as follows:

$$I_2 = -m_1(V_1 - V_2) + \frac{IT}{2} \quad \text{(Eq. 14)}$$

Then, the current $I_3$ (unit: mA) which is input to the second current-mirror circuit 30 is expressed as follows:

$$I_3 = I_2 - I_1 = 2m_1(V_1 - V_2) \quad \text{(Eq. 15)}$$

The current $I_4$ (unit: mA) which is output from the second current-mirror circuit 30 and the current $I_9$ (unit: mA) which is output from the sixth current-mirror circuit 43 are equal to the current $I_3$, and are proportional to the voltage difference between the output voltages of the first rectifying circuit 4 and the second rectifying circuit 5. Since a bias voltage is applied to the first rectifying circuit 4 and the second rectifying circuit 5 by the same bias voltage source 7, the current which flows to the p-n junction electronic device 31 is proportional to the voltage of the transmission signal.

The operation of the inverter circuit 33 and the amplifying circuit 39 is the same as that in the first embodiment shown in FIG. 1, and is not described herein.

As described above, in a transmitter detection circuit according to the present invention, a voltage-to-current converting circuit converts the voltage output from a rectifying circuit into a current so that a voltage that is proportional to the logarithm of the current is produced across a p-n junction electronic device. This provides a wider dynamic range for the detection circuit. Furthermore, a single element is only required to perform logarithmic conversion, thereby making the detection circuit compact.

The voltage-to-current converting circuit in the transmitter detection circuit according to the present invention operates differentially, and is not susceptible to the influence of variations in the power supply voltage. Thus, it is suitable for use in a portable transmitter powered by a battery.

The transmitter detection circuit according to the present invention includes a second rectifying circuit having the same structure as that of the first rectifying circuit, and the same bias voltage is applied to rectifiers of the first and second rectifying circuits. Therefore, if the characteristic of the rectifiers changes as the temperature changes, the output voltage of the detection circuit is not influenced by the change in temperature.

The p-n junction electronic device in the transmitter detection circuit according to the present invention may comprise a transistor, thereby achieving a reduced-size logarithmic converter.

The p-n junction electronic device in the transmitter detection circuit according to the present invention may comprise a diode, thereby achieving a reduced-size logarithmic converter.

The voltage-to-current converting circuit and the logarithmic converter in the transmitter detection circuit according to the present invention may be formed of only semiconductors, and may be placed into an integrated circuit. Therefore, the detection circuit can be more compact.

In the transmitter detection circuit according to the present invention, the node between a first transistor or a second transistor and a first current-mirror circuit is coupled with the ground or the power supply voltage via an adjustment resistor. Thus, an error between the first transistor and the second transistor in the integrated circuit from one lot to another can be compensated for with discrete parts.

What is claimed is:

1. A transmitter detection circuit comprising:
    a first rectifying circuit to rectify a transmission signal output from a power amplifier;
    a second rectifying circuit having the same structure as that of the first rectifying circuit; and
    a logarithmic amplifier, said logarithmic amplifier including;
       a voltage-to-current converting circuit to output an electric current that is proportional to an output voltage of said first rectifying circuit; and a two-terminal p-n junction electronic device through which the electric current flows to produce a voltage thereacross that is proportional to a logarithm of the electric current wherein the voltage-to-current converting circuit includes first and second transistors which perform a differential operation, a constant-current source connected to one of a collector and an emitter of the first and second transistors, and a first current-mirror circuit connected to the other of the one of the collector and the emitter of the first and second transistors, the output voltage of the first rectifying circuit is input to a base of one of the first transistor and the second transistor;

an input end of the first current-mirror circuit is connected to the first transistor, and an output end of the first current-mirror circuit is connected to the second transistor, thereby causing an electric current that is equal to a difference between an electric current which flows to the second transistor and an electric current which flows to the transistor at an output end side of the current-mirror circuit to flow to the p-n junction electronic device, the same bias voltage is applied to rectifiers of the first and second rectifying circuits, the output voltage of one of the first and second rectifying circuits is input to the base of the first transistor, and the output voltage of the other rectifying circuit is input to the base of the second transistor.

2. A transmitter detection circuit according to claim 1, wherein the p-n junction electronic device comprises a transistor, a base and a collector of said transistor being coupled with each other.

3. A transmitter detection circuit according to claim 1, wherein the p-n junction electronic device comprises a diode.

4. A transmitter detection circuit according to claim 1, wherein the voltage-to-current converting circuit and the p-n junction electronic device are disposed in a single integrated circuit.

5. A transmitter detection circuit according to claim 4, wherein a node between one of the first transistor and the second transistor and the first current-mirror circuit is coupled with one of a ground and a power supply voltage via an adjustment resistor.

* * * * *